US011698754B2

(12) United States Patent
McJilton et al.

(10) Patent No.: US 11,698,754 B2
(45) Date of Patent: Jul. 11, 2023

(54) COALESCING READ COMMANDS BY LOCATION FROM A HOST QUEUE

(71) Applicant: Seagate Technology LLC, Fremont, CA (US)

(72) Inventors: Charles McJilton, Longmont, CO (US); Jeffrey Pream, Berthoud, CO (US); Jonathan Henze, Savage, MN (US); Indrajit Zagade, Maharashtra (IN)

(73) Assignee: Seagate Technology LLC, Fremont, CA (US)

( * ) Notice: Subject to any disclaimer, the term of this patent is extended or adjusted under 35 U.S.C. 154(b) by 8 days.

(21) Appl. No.: 17/492,918

(22) Filed: Oct. 4, 2021

(65) Prior Publication Data

US 2022/0129378 A1    Apr. 28, 2022

Related U.S. Application Data

(60) Provisional application No. 63/198,233, filed on Oct. 5, 2020.

(51) Int. Cl.
*G06F 3/06* (2006.01)
*G06F 12/02* (2006.01)

(52) U.S. Cl.
CPC ............ *G06F 3/0659* (2013.01); *G06F 3/061* (2013.01); *G06F 3/0679* (2013.01); *G06F 12/0276* (2013.01); *G06F 2212/202* (2013.01); *G06F 2212/702* (2013.01)

(58) Field of Classification Search
None
See application file for complete search history.

(56) References Cited

U.S. PATENT DOCUMENTS

| 8,775,762 | B2 | 7/2014 | Loh et al. |
| 9,626,309 | B1 | 4/2017 | Burke et al. |
| 10,089,234 | B2 | 10/2018 | Feldman |
| 10,261,698 | B2 | 4/2019 | Ramaswamy et al. |
| 2016/0077751 | A1 | 3/2016 | Benedict |
| 2019/0259458 | A1* | 8/2019 | Shibata ............... G11C 11/5628 |

* cited by examiner

*Primary Examiner* — Charles J Choi
(74) *Attorney, Agent, or Firm* — Hall Estill Law Firm (57) ABSTRACT

Method and apparatus for managing data in a storage device, such as a solid-state drive (SSD). A non-volatile memory (NVM) is arranged into multiple garbage collection units (GCUs) each separately erasable and allocatable as a unit. Read circuitry applies read voltages to memory cells in the GCUs to sense a programmed state of the memory cells. Calibration circuitry groups different memory cells from different GCUs into calibration groups that share a selected set of read voltages. A read command queue accumulates pending read commands to transfer data from the NVM to a local read buffer. Read command coalescing circuitry coalesces selected read commands from the queue into a combined command for execution as a single batch command. The combined batch command may include read voltages for use in retrieval of the requested data.

20 Claims, 4 Drawing Sheets

COALESCING READ COMMANDS BY LOCATION FROM A HOST QUEUE

RELATED APPLICATIONS

The present application makes a claim of domestic priority to U.S. Provisional Application No. 63/198,233 filed Oct. 5, 2020, the contents of which are hereby incorporated by reference.

SUMMARY

Various embodiments of the present disclosure are generally directed to a method and apparatus for enhancing performance of a storage device, such as a solid-state drive (SSD).

In some embodiments, a non-volatile memory (NVM) is arranged into multiple garbage collection units (GCUs) each separately erasable and allocatable as a unit. Read circuitry applies read voltages to memory cells in the GCUs to sense a programmed state of the memory cells. Calibration circuitry is provided to group different memory cells from different GCUs into calibration groups that share a selected set of read voltages. A read command queue accumulates pending read commands to transfer data from the NVM to a local read buffer. Read command coalescing circuitry coalesces selected read commands from the queue into a combined command for execution as a single batch command. The combined batch command may include read voltages for use in retrieval of the requested data.

These and other features and advantages which characterize the various embodiments of the present disclosure can be understood in view of the following detailed discussion and the accompanying drawings.

DETAILED DESCRIPTION

The present disclosure generally relates to the management of data transfer commands in a data storage device, such as but not limited to a solid-state drive (SSD).

Storage devices generally include a controller and a non-volatile memory (NVM). The controller communicates with a host (client) device to direct the storage of user data from the client device to the NVM, and to retrieve and transfer the user data from the NVM to the client device.

Solid-state drives (SSDs) are a popular form of storage device commonly used in current generation storage systems. A typical SSD has an SSD controller and a non-volatile memory (NVM) arranged as a flash memory (or other form of semiconductor based memory). The flash memory includes front end electronics (FME) and multiple flash memory semiconductor dies coupled to shared channels, which are physical data pathways connected to the dies as well as associated control circuitry. Internal data transfer commands are issued by the SSD controller to the flash memory to transfer data between local memory (data caches, buffers, etc.) of the controller and the flash memory.

The commands issued by the controller can take a variety of forms, including reads, writes (programming) and erasures. Reads retrieve data from the NVM, writes program data to the NVM, and erasures reset the NVM to accommodate new data. Other forms of commands can be issued as well, such as calibration commands, status commands, data commands, etc.

The commands issued by the controller can further be segregated into host commands and background commands. Host commands, such as host read or write commands, are initiated by the external host (client). Background commands are those generated by the controller to prepare and maintain the device in a condition available to service the host commands. Background commands can include data relocation commands where data sets are relocated to a new location, garbage collection commands where locations of memory are reclaimed to store new data, calibration operations where parameters are measured to ensure the writing and reading of data can be carried out efficiently under the current environmental conditions, map metadata updates where map metadata are loaded to local memory, updated and then stored to NVM, and so on.

The NVM may be arranged into garbage collection units (GCUs), which are separately erased and allocated as a unit. One commonly employed convention is to form each GCU to incorporate a separate erasure block from each of N semiconductor memory dies, where N is a large plural number. In this way, a data set (parity set) can be distributed across the N dies, with the parity set made up of user data plus parity information to recover the user data based on a system error, such as the failure of one or more of the dies. One currently employed embodiment sets the number of blocks at 32 (e.g., N=32) so that each GCU is made up of one erasure block from each of 32 dies, and each parity set comprises 32 pages of data, with a separate page written to a different die. The parity information can be generated using well known RAID (redundant array of independent discs) techniques, such as RAID 5, RAID 7, etc. Other data storage configurations can be used.

A garbage collection operation involves identifying current version user data blocks in a selected GCU, reading these current version data blocks out of the selected GCU, and rewriting these current version data blocks to a new GCU elsewhere in the flash memory. The selected GCU is then subjected to an erasure operation to erase (reset) the selected GCU, allowing the erased GCU to be returned to an allocation pool pending allocation for the storage of new write data. The number of program/erase (P/E) cycles is usually tracked on a GCU basis, since erasable memories such as flash have a limited number of P/E cycles that can be applied to the flash memory cells over the operational life of the memory.

The map metadata structures may include a forward map, which serves as a flash transition layer (FTL) to provide a logical-to-physical translation to enable the system to locate the requested data. Because flash memories are erasable, new blocks of data need to be written to new locations, and older versions of the data blocks with the same logical addressing need to be marked as stale. Hence, each write operation involves not only the preparation and writing of the write data to a new location, but also requires the updating of the map metadata to enable the system to locate the most current version of the data.

As noted above, garbage collection refers to a process whereby sections of the memory are reclaimed for the storage of new user data. Garbage collection is performed on a GCU basis, and is usually enacted once the percentage of stale data in a given GCU reaches a selected threshold. Garbage collection can also be performed to maintain at least a selected amount of available storage capacity in the NVM to accommodate new write data.

Pending data transfer commands (whether host commands or background commands) are accumulated into one or more command queues. A queue manager mechanism is used to select among these various queues to identify an appropriate order in which the commands are executed. Depending upon the operational environment, the queue manager will tend to assign priority to host commands over background commands, and further will tend to give priority to host read commands over host write commands.

These differentiations among different types of commands are based on the fact that the timely completion of host commands will tend to have a greater impact on host I/O performance as compared to background commands. Moreover, priority among host commands tends to be given to read commands over write commands because writeback caching can be applied in some configurations so that write data from a host can be cached and delayed before writing to the NVM, but the host can tell whether the storage device has returned the requested data. Because host processes are usually waiting to receive the requested data, host read commands are usually given the highest priority and the system works to provide host readback data at or above some minimum specified I/O rate, and then perform the remaining types of commands at some rate that ensures long term satisfactory performance.

Collisions refer to situations where multiple pending commands in the command queue(s) require overlapping resources within the SSD in order to be executed, and so the commands cannot be carried out at the same time. Normally, at any given time, one command is selected for execution, and the remaining command(s) are placed on hold until the necessary resource(s) become available. A certain level of collisions is unavoidable based upon the use of distributed and shared resources within the storage device, but reducing collisions, particularly collisions involving host read commands, is advantageous in that higher sustained host I/O performance can be obtained.

Various embodiments of the present disclosure are generally directed to a method and apparatus of coalescing, or combining, multiple pending host read commands based on a common factor (e.g., "common location") associated with the read commands.

In some embodiments, the common factor can include read commands having same or associated page addresses, same or similar grouping of page addresses (including pages that share the same memory cells), the same die(s), and/or the same calibration group (e.g., geographically distributed locations that use the same set of vRef read voltages). Other factors can be used as well to intelligently sort and group together the pending host reads.

Once a group of pending host read commands are identified, the reads are coalesced and executed at the same time (such as in a batch mode). This reduces the amount of data that needs to be forwarded to the FME. Multiple reads may be carried out internally by the FME to return the requested data for the group read. Because of the commonality of location, we should obtain faster error recovery (e.g., faster decode, preloading of LLR in LDPC decoders, etc.).

The commonality may not necessarily be apparent since the pending host commands may largely be sorted/maintained by logical address in the host queue. Separate mechanisms can be used to identify and sort the pending host commands to identify and measure the common location criteria.

By coalescing the group reads from the host queue, it is contemplated that potential collisions will be reduced and faster data transfer performance will be achieved. The read coalescing function may be a feature that is selectively activated once the host queue depth reaches a sufficient level that the opportunities for coalescing exist and the additional processing can be justified. History statistics can be measured so that the level at which this processing is enacted is adjusted over time. Other adaptive adjustments can be made over time as well, such as changes in calibration groups of memory cells that share a common set of calibrated read voltage settings. Previously successful groups can be identified over time to further streamline the selection/grouping process.

Figure 1:
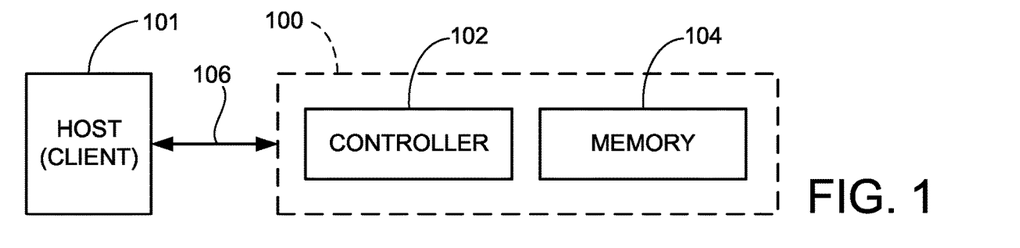
FIG. 1 provides a functional block representation of a data storage device constructed and operated in accordance with various embodiments of the present disclosure.

These and other features and advantages of various embodiments can be understood beginning with a review of FIG. 1 which provides a functional block representation of a data storage device 100. The storage device 100 is coupled to a host (client) device 101. The storage device 100 includes a controller 102 and a memory 104. The controller 102 provides top-level control of the memory 104 and processes communications with the client 101. The memory 104 provides non-volatile memory (NVM) for the storage of user data from the client. The controller 102 is an electrical circuit that may take the form of a programmable CPU processor that operates in conjunction with programming stored in a computer memory within the device. The controller may alternatively be a hardware based circuit, or may incorporate both programmable and hardware circuit aspects. Commands and data are transferred between the client device 101 and the storage device 100 using a suitable host interface 106.

Figure 2:
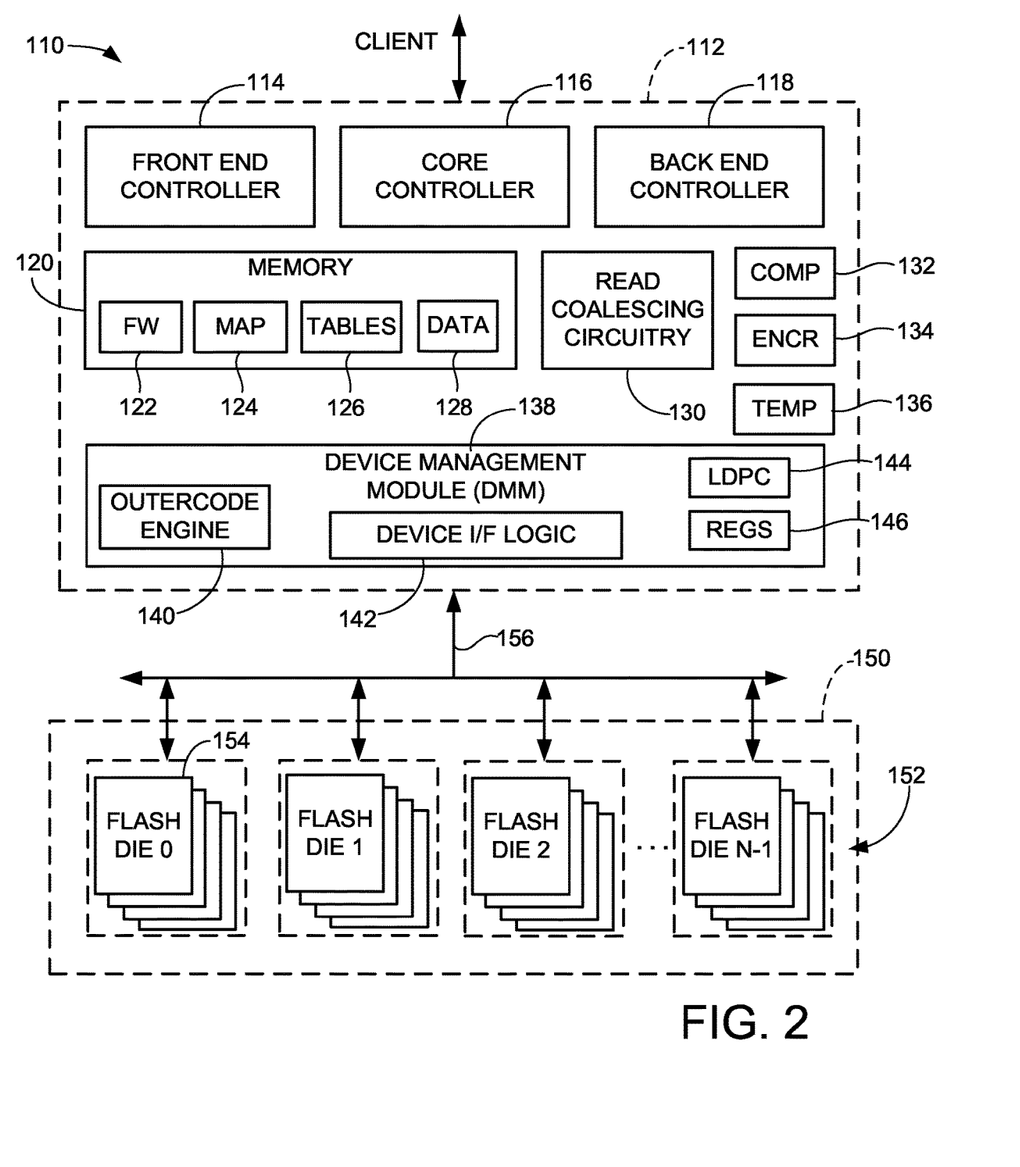
FIG. 2 illustrates the device of FIG. 1 characterized as a solid-state drive (SSD) in accordance with some embodiments.

FIG. 2 describes relevant aspects of an exemplary data storage device 110 corresponding to the device 100 of FIG. 1. The device 110 is a solid-state drive (SSD) that communicates with one or more client devices via one or more Peripheral Component Interface Express (PCIe) ports. The NVM comprises 3D NAND flash memory, although other forms of memory can be used. While an SSD is being presented as a particularly useful form of storage device, it will be understood that other forms of storage devices can be utilized as well. Moreover, the following discussion can be equally applied to other storage environments, including arrays of storage devices that incorporate SSDs and/or other forms of storage devices.

In at least some embodiments, the SSD 110 operates in accordance with the NVMe (Non-Volatile Memory Express) specification, which enables different users to allocate NVM sets (die sets) for use in the storage of data. Each die set may form a portion of an NVMe namespace that may span multiple SSDs or be contained within a single SSD. Each NVMe namespace will be owned and controlled by a different user (owner).

The SSD 110 includes a controller circuit 112 that corresponds to the controller 102 in FIG. 1. The controller circuit 112 has a front end controller 114, a core controller 116 and a back end controller 118. The front end controller 114 performs host I/X functions, the back end controller 118 directs data transfers with the memory module 114 and the core controller 116 provides top level control for the device.

Each controller 114, 116 and 118 includes a separate programmable processor with associated programming (e.g., firmware, FW) in a suitable memory location, as well as various hardware elements to execute data management and transfer functions. Alternatively, some or all of the controllers 114, 116 and 118 may be realized using a single processor. A controller memory 120 represents various forms of volatile and/or non-volatile memory (e.g., SRAM, DDR DRAM, flash, etc.) utilized as local memory by the controller 112. Various data structures and data sets may be stored by the memory including loaded firmware (FW) 122, map data 124, table data 126 and user data 128 in read/write buffers temporarily cached during host data transfers. The map data 124 may take the form of a flash transition layer (FTL) to identify physical locations at which logically addressed blocks of user data are stored.

Read coalescing circuitry 130 is incorporated into the controller 112 using hardware and/or firmware. As explained below, the circuitry 130 manages the coalescing, or aggregation, of pending read commands issued by the client 101 for concurrent execution to reduce the incidence of collisions during operation of the SSD.

Continuing with FIG. 2, the controller 112 can include further features such as a data compression (COMP) block 132 which applies lossless data compression to input data sets during write operations to enhance storage efficiency. An encryption (ENCR) block 134 applies cryptographic processing such as encryption/decryption to provide data security for the SSD. A temperature (TEMP) block 136 uses one or more temperature sensors to monitor and record temperatures of the SSD during operation.

A device management module (DMM) 138 supports back end processing operations of the SSD. The DMM 138 includes an outer code engine circuit 140 to generate outer code, a device I/F logic circuit 142, and a low density parity check (LDPC) circuit 144 configured to generate and use LDPC codes as part of an error detection and correction strategy to protect the data stored by the SSD. A number of registers (REGS) 146 are provided to temporarily accumulate and store data during data transfer operations.

A memory module 150 is coupled to the controller 112 via the DMM 138. The memory module 150 corresponds to the memory 104 in FIG. 1, and includes a non-volatile memory (NVM) in the form of a flash memory 152 distributed across a plural number N of flash memory dies 154. Flash memory control electronics (not separately shown in FIG. 2) facilitate parallel data transfer operations via a plural number M channels (lanes) 156. In one embodiment, the flash memory 150 has 256 dies 154 (e.g., N=256) serviced by 8 channels 156 (e.g., M=8) so that 32 dies are coupled to each channel. Only one die can be accessed by each channel at a time, although up to eight dies can be accessed in parallel at a time using all eight channels. Other arrangements can be used, including other numbers of dies and channels, other arrangements of the same, etc.

While not limiting, modern SSDs and other data storage device systems are often formed from integrated memory modules such as 104, 150 that are commercially available from a source of such devices. The memory modules are integrated into an SSD by a device manufacturer which supplies the controller functions in a separate controller 102,112. The controller may be a single integrated circuit such as in the case of a system on chip (SOC) design, or a grouping of integrated circuits.

In this arrangement, the controller and memory modules are separate operational entities which communicate across one or more internal command and data interfaces. A pull system is commonly used in which the controller issues commands to the memory, and then repetitively sends status inquiries to the memory to determine whether the commands have been completed.

Once the memory signals that a particular command has been completed, the controller may issue additional commands to the memory. For example, when the memory sends a command complete status for a read command, the controller may send a data transfer command to cause the memory to transfer the recovered data to the controller. While any number of different schemes can be employed to handle the interactions between the controller and the memory, it will be noted at this point that the various embodiments presented herein are particularly directed to improvements in the command and data exchanges between the controller and the memory.

Figure 3:
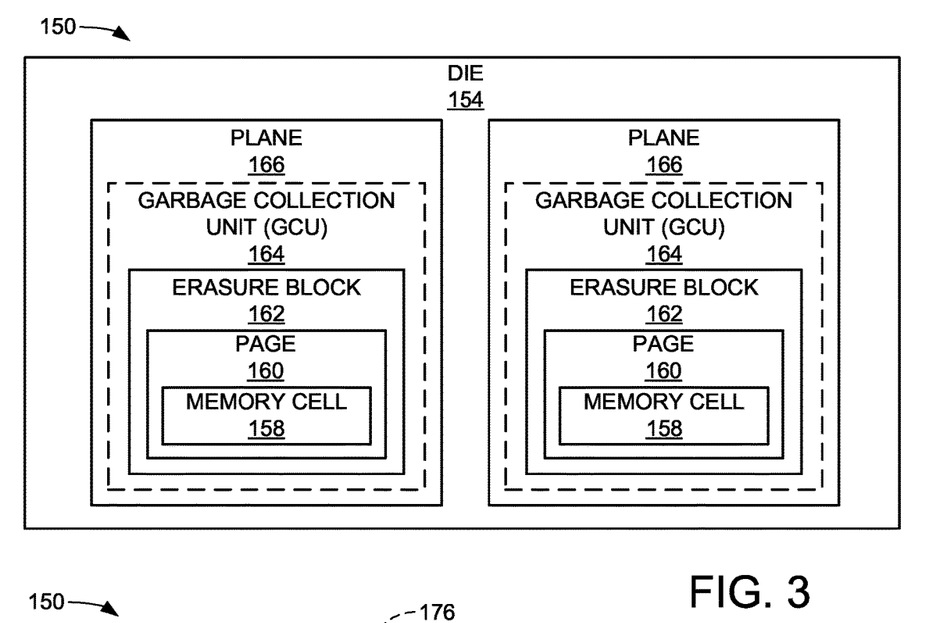
FIG. 3 shows a physical and logical layout of a flash die from FIG. 2 in some embodiments.

FIG. 3 shows a physical/logical arrangement of the various flash memory dies 154 in the flash memory module 150 of FIG. 2 in some embodiments. Each die 154 incorporates a large number of flash memory cells 158. The cells may be arrayed in a three-dimensional (3D stacked) arrangement with various control lines (e.g., source, bit, word lines) to access the cells. Each memory cell may take the general form of a MOSFET (metal oxide semiconductor field effect transistor) with respective gate, drain and source interconnections. Each cell further includes a floating gate electrically isolated from the control gate adapted to store accumulated charge to provide a programmed state.

Groups of cells 158 are interconnected to a common word line to accommodate pages 160, which represent the smallest unit of data that can be accessed at a time. Depending on the storage scheme, one or more pages of data may be written to the same physical row of cells, such as in the case of SLCs (single level cells with one bit per cell), MLCs (multi-level cells with two bits per cell), TLCs (three-level cells with three bits per cell), 4LCs (four-level cells with four bits per cell), and so on. Generally, n bits of data can be stored to a particular memory cell 158 using $2^n$ different charge states (e.g., TLCs use eight distinct charge levels to represent three bits of data, 4LCs use sixteen distinct charge levels to represent four bits of data, etc.). The storage size of a page can vary; some current generation flash memory pages are arranged to store 32 KB (32,768 bytes) of user data plus associated LDPC code bits.

The memory cells 158 associated with a number of pages are integrated into an erasure block 162, which represents the smallest grouping of memory cells that can be concurrently erased in a NAND flash memory. A number of erasure blocks 162 are incorporated into a garbage collection unit (GCU) 164, which are logical storage units that utilize erasure blocks across different dies and which are allocated and erased as a unit.

During operation, a selected GCU is allocated for the storage of user data, and this continues until the GCU is filled. Once a sufficient amount of the stored data is determined to be stale (e.g., no longer the most current version), a garbage collection operation can be carried out to recycle (garbage collect) the GCU. This includes identifying and relocating the current version data to a new location (e.g., a new GCU), followed by an erasure operation to reset the memory cells to an erased (unprogrammed) state. The recycled GCU is returned to an allocation pool for subsequent allocation to begin storing new user data. In one embodiment, each GCU 164 nominally uses a single erasure block 162 from each of a plurality of dies 154, such as 32 dies. The dies in a given GCU may be affixed to a single channel 156, or spread across multiple channels (see FIG. 2).

Each die 154 may further be organized as a plurality of planes 166. Examples include two planes per die as shown in FIG. 3, although other numbers of planes per die, such as four or eight planes per die can be used. Generally, a plane is a subdivision of the die 154 arranged with separate read/write/erase circuitry such that a given type of access operation (such as a write operation, etc.) can be carried out simultaneously by each of the planes to a common page address within the respective planes.

Figure 4:
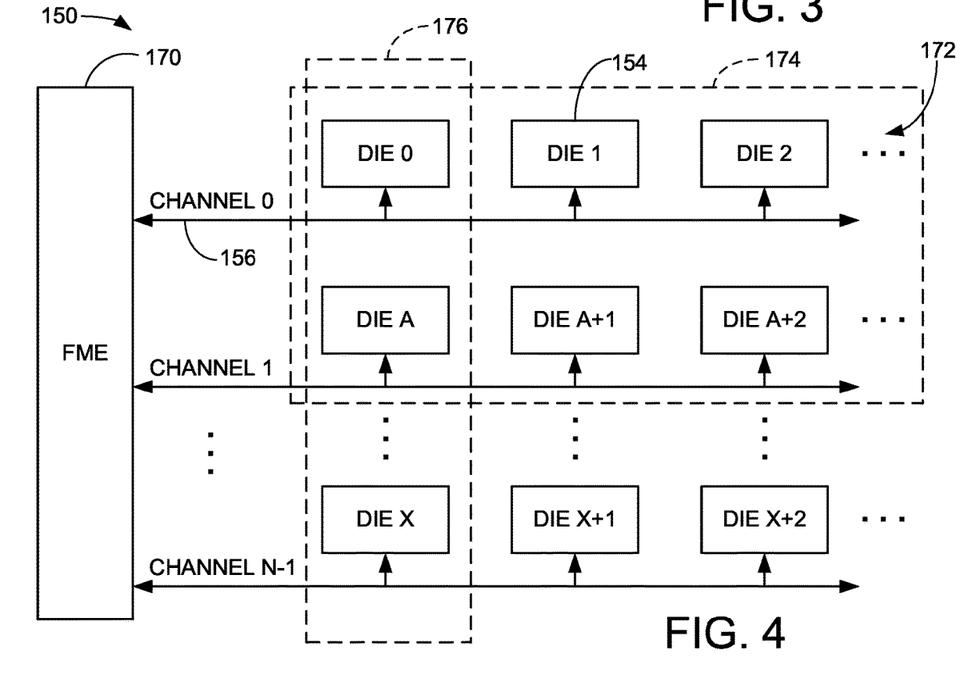
FIG. 4 illustrates an arrangement of the non-volatile memory (NVM) of FIG. 2 as different die sets in some embodiments.

FIG. 4 shows an arrangement of the flash memory dies 154 in conjunction with a flash memory electronics (FME) module 170 in further embodiments. The FME 170 may be divided among multiple processors that serve, collectively, as a front end for the flash memory module 150 (see FIG. 2). Groups of the dies 154 are connected to individual channels 156 to form die sets 172. Each die set 172 represents the dies 154 connected to an individual die. As noted above, one configuration provides a total of 256 dies interconnected using eight (8) channels so that each channel is connected to 32 dies. Other arrangements can be used. Only a single die can be accessed via the associated channel at a time. The dies 154 can be arranged into different groupings, such as a first grouping 174 which incorporates all of the dies affixed to the first two channels 156 (e.g., channels 0 and channel 1). In this case, the first grouping 174 constitutes the first 64 dies in the array.

A second die grouping is represented at 176. This represents a single die (8 in total) that are spread across all of the channels 156 (from channel 0 to channel N−1). Other die groupings can be made as desired. It will be appreciated that accessing die group 174 requires access to channels 0 and 1, while accessing die grouping 176 requires access to all of the channels (channels 0 through N−1). Different arrangements of the dies thus provides different access rates; if the dies are arranged into subgroups that use subsets of the available channels, then faster average I/O transfer rates can be obtained in parallel for multiple data sets; if the arrangements of the dies are provided across all the channels, then individual data sets across all the channels can provide faster I/O transfer rates but other transfers will need to wait until all of the channels are available, and so on.

Figure 5:
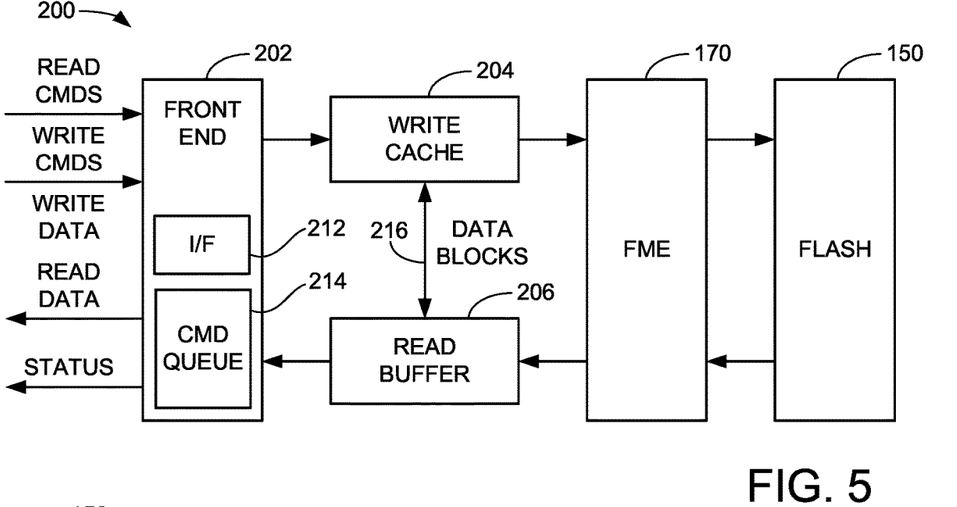
FIG. 5 depicts data paths through the SSD during the servicing of client access (read and write) commands in some embodiments.

FIG. 5 shows another aspect of the SSD 110 of FIG. 2, with regard to data transfer circuitry 200. The circuitry 200 of the SSD 110 includes a front end 202, a write cache 204, and a read buffer 206. These elements interface with the flash memory electronics (FME) 170 and the and flash memory module 150.

The front end 202 interfaces with one or more client devices 101 (FIG. 1) using an interface (I/F) circuit 212. Pending access commands, either from the client device or internally generated, are stored in one or more command queues 214.

During normal operation of the SSD 110, the client(s) will issue various access commands including read and write commands. Each client read command will constitute a request for some logical range (e.g., LBA range) of blocks to be retrieved from flash 150. Each client write command will constitute a request to store some logical range of blocks to the flash, and will be accompanied by a transfer of the associated writeback data from the client to the storage device.

The front end 202 processes these and other commands and arranges the respective read and write commands into one or more of the command queues 214 pending execution. The writeback data are stored in the write cache 204 and are subjected to processing as described above in FIG. 4 to arrange the writeback data into code words, pages, parity sets, etc. Additional processing may be applied as well, such as encryption and compression.

At such time that a command scheduler (not separately shown) of the controller 112 selects the next command to be serviced, the associated command/data are forwarded to the FME 170, which in turn directs the same to the flash 150. As noted above, the FME 170 is a rudimentary front end on each die or set of dies and serves to direct commands and data to the local read/write/erase circuitry of the respective planes. In the case of a write command, the writeback data are written to the next set of available pages 160 in an allocated GCU 164 (FIG. 3). In the case of a read command, the data are retrieved, subjected to error correction and other signal processing steps, and placed in the read buffer. The map metadata are accessed and updated as required during these operations.

Client read commands tend to receive priority over other commands, including client write commands and background commands, on the basis that the client is likely waiting for the requested readback data before it can proceed with subsequent processing steps. At the same time, the command scheduler function of the controller needs to execute the background operations (e.g., garbage collection, map updates, calibrations, etc.) at a sufficient rate to enable the storage device to continue to service the client access commands at acceptable performance levels. Another complicating factor is that the various competing pending commands and background operations may require the use of shared resources that have to be made available before the next command can be carried out. These resources can include data buffers, decoders, encryption/decryption circuitry, lanes, dies, registers, map data, etc.

Figure 6:
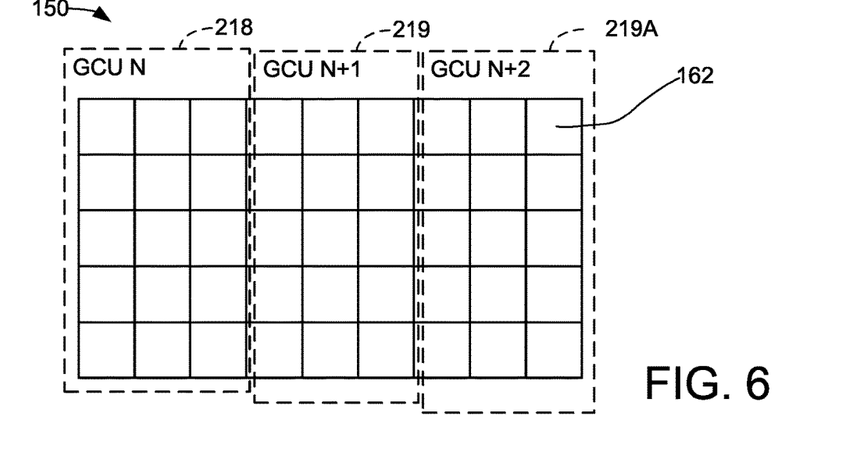
FIG. 6 shows different GCUs (garbage collection units) that can be arranged within the flash memory of the device of FIG. 2.

Continuing with FIG. 5, the front end 202 provides various statuses to the client, including command complete statuses when commands are completed. For completed read commands, the command complete status may indicate that the requested readback data have been successfully retrieved and are now available for transfer from the read buffer 206. If writeback caching techniques are employed, the front end 202 may proceed to issue a write command complete status to the client, even if the writeback data are still pending in the write cache 204 and have not yet been written to the flash 150. To this end, the write cache 204 may take the form of NVM, such as NAND or NOR flash, although such is not necessarily required. The read cache 206 may normally be volatile memory, such as DRAM, since the readback data in the read cache can always be re-read from the non-volatile flash if required. In some cases, data blocks may be internally transferred between the write cache 204 and the read buffer 206, as indicated by internal data path 216. FIG. 6 shows different arrangements of GCUs in the flash memory 150 of FIG. 5.

GCU N 218 incorporates a first set of erasure blocks 162 across various dies 154 of the flash memory 150. GCU N+1 219 incorporates a different, second set of erasure blocks 162 across various dies 154 of the flash memory 150. GCU N+2 incorporates yet another different, third set of erasure blocks 162 across a different set of dies 154. In one embodiment, each GCU 218, 219, 219A has 32 erasure blocks on 32 different dies, but other arrangements can be used; for example, GCU N+1 might have a different number of erasure blocks than GCU N, and GCU N+2 might have still a different number of erasure blocks than GCU N or GCU N+1. The prefetched data can be from the same GCU, or from a different GCU that utilizes the same or similar resources. It will be noted that the various erasure blocks in the respective GCUs may distributed among a common set of dies, or among different sets of dies.

Figure 7:
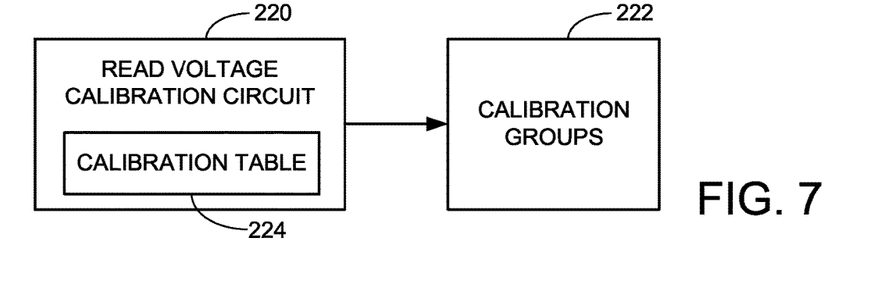
FIG. 7 depicts a read voltage calibration circuit configured to perform read voltage calibration operations upon calibration groups of memory cells of the NVM of FIG. 2.

FIG. 7 shows a read voltage calibration circuit 220 that operates at selected times upon various groups of memory cells 158 to establish appropriate read voltages, also referred to as reference voltages (Vrefs), for calibration groups 222 of the memory cells. As will be recognized, data are retrieved from the various memory cells based on the application of read voltages to the control gates of the cells. The programmed state of a cell can be determined in relation to the magnitude of the voltage applied to the control gate to place the cell in a conductive (drain-source) configuration. The greater the amount of accumulated charge on the interior floating gate, the greater the amount of gate control voltage (read reference voltage) will be necessary to place the cell in a conductive state.

The appropriate read voltages necessary to distinguish among various programmed states (e.g., to discern the amount of accumulated storage on the floating gates of the cells) will vary over time based on a number of factors, including program temperature, read temperature, number of reads, data aging, etc.

Accordingly, it is common to initiate a background read voltage calibration operation that periodically goes through the flash memory array and establishes up-to-date appropriate read voltage levels. Empirically, cells that have the same or similar voltage settings can be grouped together into the various calibration groups 222 of cells across which the same set of read voltage levels can be applied to read the programmed states.

It will be appreciated that the calibration groups may be different than the GCU groupings in FIG. 6; indeed, the calibration groups may span multiple GCUs, dies, arrays, planes, pages, etc. The most up-to-date calibrated read voltage values may be stored in a calibration table 224, and referenced whenever a read command is being supplied to the FME 170 (FIG. 5).

In some cases, a read command will be issued without the provision of read command values from the calibration table 224, allowing the flash memory to utilize its own internally established read voltages in an effort to retrieve the data. In this arrangement, should the flash memory module not be able to successfully retrieve the data, a request may be made to the controller to supply appropriate read values, in which a follow up command can be supplied to the FME to supply reference voltage values from the calibration table 224 in an effort to enable the system to retrieve the stored data.

In other cases, each read command supplied to the FME includes a set of read voltages (or in some cases, multiple sets of read voltages) from the calibration table 224. In this arrangement, the FME uses those calibrated read voltages during the read operation to retrieve the data.

Figure 8:
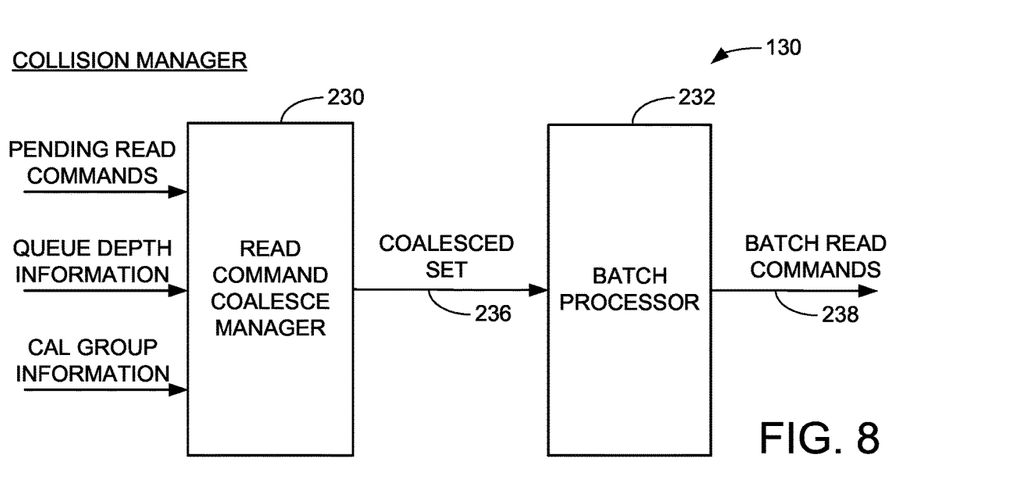
FIG. 8 depicts read coalescing circuitry of FIG. 2 in some embodiments.

With this overview of relevant aspects of the SSD, reference is now directed to FIG. 8 which provides a read command coalesce manager 230 and a batch processor 232. These circuits are incorporated into the read coalescing circuitry 130 from FIG. 2.

The manager 230 receives inputs from a number of locations within the system including a listing of pending read commands (both host commands from the host and background commands based on various background processes), queue depth information relating to overall numbers of pending commands in the command queue(s), calibration group information, etc. Other data and parametric information can be utilized as well, depending on the configuration of the system.

In response, the manager 230 identifies coalesced sets of read commands that can be arranged into batches, which are forwarded to the batch processor 232, as indicated by path 236. Each coalesced set of read commands represents a plurality of (multiple) read commands that should be executed as a batch by the FME/flash. The read commands share some commonality of location, in that execution can be carried out efficiently. As noted above, the read commands may include data associated with memory cells that are included in the same calibration group, the same set of die/channel combinations, the same page addresses, etc.

The batch processor operates to forward a single batch read command to the FME, as indicated via path 238. In this way, the read command can be communicated using a reduced communication footprint; for example and not by limitation, if multiple pending read commands involve the retrieval of data within the same calibration group (222, FIG. 7), then a single set of reference voltages can be communicated with the batch command to be applied to all of the read data, irrespective of GCU, LBA, die, channel, or other considerations. The circuitry 130 thus identifies commonalities that might not otherwise be immediately apparent based on the LBA ranges, timing sequence, or types of the read commands.

Figure 9:
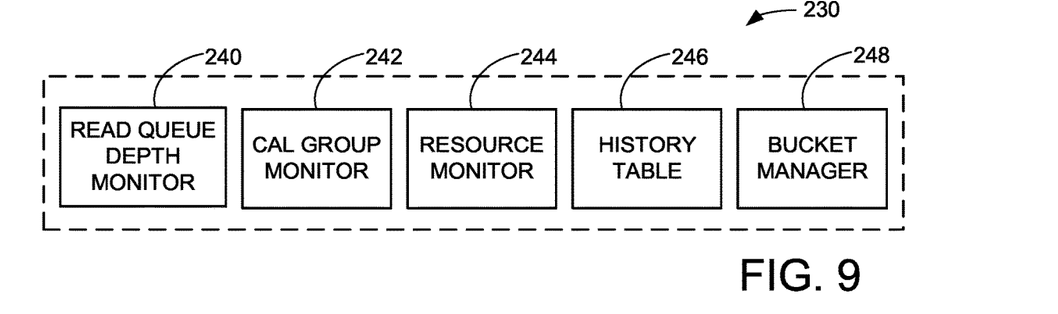
FIG. 9 shows aspects of a read command coalesce manager of FIG. 8.

FIG. 9 shows aspects of the manager 230 of FIG. 8 in some embodiments. Other arrangements can be used so this is merely illustrative and not limiting. The manager 230 includes a read depth queue monitor circuit 240 that monitors the depth of the various command queues 214 (FIG. 5). These measurements can be in terms of total overall pending commands, total number of pending read commands, total number of pending host commands, etc. Generally, as noted above a minimum threshold queue depth may be necessary to initiate operation of the circuitry 130, on the basis that the read consolidation operation may find best usefulness when a relatively larger number of read commands are pending. This threshold may be adaptively adjusted based on performance.

A calibration group monitor circuit 242 tracks the grouping of memory cells within the flash array that utilize the same read voltage thresholds. A resource monitor circuit 244 evaluates the read commands based on resource requirements, such as die/channel combinations, in order to enable the system to identify read commands that can be executed concurrently or otherwise in an efficient manner. A history table 246 is a data structure maintained in local memory (e.g., memory 120, FIG. 2) that tracks history data associated with previous sets of batch processed read commands, including performance, read command issues, etc. Finally, a bucket manager circuit 248 establishes a bucket mechanism to enable the efficient accumulation of similar read commands.

Figure 10:
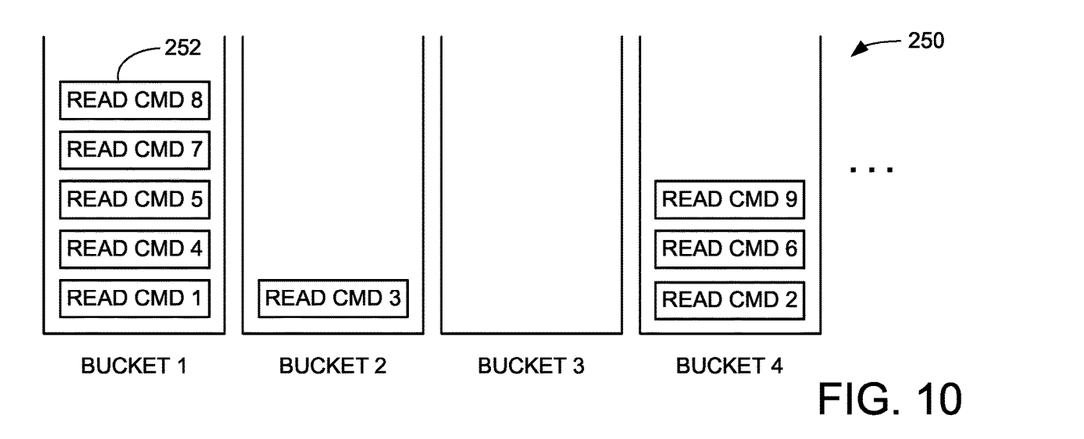
FIG. 10 depicts buckets of associated read commands for incorporation into batch read commands by a batch processor of FIG. 8 in some embodiments.

The operation of the bucket manager 248 can be understood with a review of FIG. 10, which shows a number of buckets 250. Only four (4) such buckets are shown, but it will be understood that any number of different forms of granularity can be applied to the system as required. Each bucket 250 represents a location range in which localized read commands can be associated. In the illustrative example of FIG. 10, a total of nine (9) read commands 252 have been aggregated from the existing read command queue(s). A total of five (5) read commands are in Bucket 1, a single read command is in Bucket 2, no read commands are in Bucket 3, and three (3) read commands are in Bucket 4. Other read commands, and other buckets, are contemplated.

Generally, it is contemplated that the five (5) read commands in Bucket 1 have sufficient commonality of location that it would be efficient to combine these into a combined batch read command issued by the batch processor 232 (FIG. 8). The read commands (e.g., read commands 1, 4, 5, 7 and 8) may all be stored in memory cells 158 that belong to a common calibration group 232 (FIG. 7); these may additionally or alternatively be in geographical locations within the various dies 154 that provide efficient operation (either successively or concurrently); these may be further grouped into a single GCU 164 or in multiple associated GCUs, and so on. Regardless, once a selected number of associated read commands have been accumulated, the batch processor 232 may proceed to issue the read commands to the FME 170 (FIG. 5) for consolidated processing.

Once a batch read process command has been issued, the FME will proceed to instruct the local flash circuitry to retrieve the requested data, and retrieve the same to the local read buffer 206. The data may be retrieved in piece-meal fashion, so that some read data sets may be retrieved prior to other sets. However, because of the commonality of the locations associated with the read commands in the batch request, additional efficiencies may be gained, such as similar LDPC recovery settings, the use of outercode to recover the data, etc. Accordingly, process efficiencies are anticipated on both the front end (requesting the read) as well as on the back end (the actual recovery of the data).

It is contemplated that normal read command processing, as well as normal processing of other commands (e.g., write commands, erasure commands, garbage collection commands, etc.) will take place in parallel with the batch read commands. Accordingly, the batch processing will be enacted at times to enhance the flow through processing of the system, but will not otherwise delay or adversely impact the ongoing I/O performance of the system.

Various embodiments have contemplated operation in the context of an SSD, but this is merely for purposes of illustration and not limiting. Other forms of processing devices, including but not limited to hard disc drives (HDDs), hybrid drives, tape drives, etc. can also incorporate the various embodiments presented herein. Systems that incorporate multiple storage devices into an array are also contemplated.

It is to be understood that even though numerous characteristics and advantages of various embodiments of the present disclosure have been set forth in the foregoing description, together with details of the structure and function of various embodiments of the disclosure, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. Apparatus comprising:
a non-volatile memory (NVM) arranged into multiple garbage collection units (GCUs) each separately erasable and allocatable as a unit;
read circuitry arranged to apply read voltages to memory cells in the GCUs to sense a programmed state of the memory cells;
calibration circuitry configured to group different memory cells from different GCUs into calibration groups that share a selected set of read voltages;
a read command queue that accumulates pending read commands to transfer data from the NVM to a local read buffer; and
read command coalescing circuitry configured to coalesce selected read commands from the queue into a combined command for execution as a single batch command, the selected read commands retrieving data from memory cells in multiple GCUs in a selected calibration group.

2. The apparatus of claim 1, wherein each of the selected read commands are characterized as host read commands issued by a host device, wherein execution of the host read commands results in a transfer of requested data associated with the read commands from the local read buffer across an external interface to the host device.

3. The apparatus of claim 1, wherein the read command coalescing circuitry comprises a queue depth monitor which monitors a total number of read commands pending execution upon the NVM.

4. The apparatus of claim 3, wherein the total number of read commands pending execution include host read commands issued by a host and background read commands generated internally by a storage device controller.

5. The apparatus of claim 1, wherein the read command coalescing circuitry comprises a calibration group monitor circuit that groups the read commands into batch groups based on storage locations in the NVM in which readback data associated with the read commands being associated with a common calibration group.

6. The apparatus of claim 1, wherein the calibration circuitry establishes the calibration groups across multiple ones of the GCUs.

7. The apparatus of claim 1, wherein the read command coalescing circuitry further comprises a resource monitor which associates, for each of the read commands in various read command queues, a corresponding set of resources, the set of resources comprising a particular die/channel combination within the NVM required to be accessed to execute the corresponding read command.

8. The apparatus of claim 1, wherein the read command coalescing circuitry further comprises a history table as a data structure stored in a memory which operates to accumulate history data statistics on prior executions of batch read commands by the read command coalescing circuitry.

9. The apparatus of claim 1, wherein the read command coalescing circuitry comprises a read command coalesce manager circuit which identifies coalesced sets of read commands based on an overview of all pending read commands in the command queues, queue depth information, and calibration group information.

10. The apparatus of claim 9, wherein the read command coalescing circuitry further comprises a batch processor which issues a batch read command to the NVM for an associated coalesced set of read commands, the batch read command including a set of parameters to be used for each of the individual read commands in the batch read command.

11. The apparatus of claim 10, wherein the set of parameters comprise read voltage levels to be applied during the retrieval of readback data associated with the batch read command.

12. The apparatus of claim 1, wherein the read command coalescing circuitry forms a portion of a controller of a data storage device, the controller comprising at least one programmable processor and associated firmware (FW) stored in a local memory location executed by the at least one programmable processor.

13. The apparatus of claim 1, characterized as a solid-state drive (SSD), wherein the NVM is characterized as a flash memory.

14. A method comprising:
   storing data in a non-volatile memory (NVM) from a host device, the NVM arranged into multiple garbage collection units (GCUs) each separately erasable and allocatable as a unit;
   accumulating read commands in a command queue pending execution to transfer the stored data from the NVM to a local read buffer;
   performing periodic read calibration operations to select a set of read voltages used during read operations upon calibration groups of memory cells in the NVM selected from different ones of the GCUs; and
   coalescing selected read commands from the command queue into a combined batch read command, the selected read commands configured to retrieve data from respective memory cells in multiple GCUs in a selected calibration group; and
   executing the combined batch read command.

15. The method of claim 14, wherein each of the selected read commands are characterized as host read commands issued by the host device, wherein execution of the host read commands results in a transfer of requested data associated with the read commands from the local read buffer across an external interface to the host device.

16. The method of claim 14, wherein the coalescing step comprises generating the combined batch read command responsive to a queue depth of the command queue exceeding a predetermined threshold.

17. The method of claim 16, further comprising accumulating history data associated with operation of the NVM, and adaptively adjusting the predetermined threshold responsive to the accumulated history data.

18. The method of claim 14, wherein the coalescing step comprises generating the combined batch read command responsive to a total number of the selected read commands in the combined batch read command exceeding a predetermined threshold.

19. The method of claim 14, wherein each combined batch read command is generated responsive to an overview of all pending read commands in the command queues, queue depth information, and calibration group information, and each combined batch read command includes a common set of read voltages to be applied by the NVM during execution thereof.

20. The method of claim 14, wherein the command queue comprises host commands issued by the host and background commands generated by a controller associated with the NVM.

* * * * *